(12) United States Patent
Lin et al.

(10) Patent No.: US 12,105,904 B2
(45) Date of Patent: Oct. 1, 2024

(54) ELECTRONIC DEVICE

(71) Applicant: InnoLux Corporation, Miao-Li County (TW)

(72) Inventors: Shun-Mao Lin, Miao-Li County (TW); Hsing-Yuan Hsu, Miao-Li County (TW); Po-Yang Chen, Miao-Li County (TW); I-An Yao, Miao-Li County (TW)

(73) Assignee: INNOLUX CORPORATION, Chu-Nan (TW)

( * ) Notice: Subject to any disclaimer, the term of this patent is extended or adjusted under 35 U.S.C. 154(b) by 32 days.

(21) Appl. No.: 17/579,519

(22) Filed: Jan. 19, 2022

(65) Prior Publication Data

US 2022/0269365 A1     Aug. 25, 2022

(30) Foreign Application Priority Data

Feb. 19, 2021  (CN) .......................... 202110188475.8

(51) Int. Cl.
*G06F 3/044* (2006.01)
*G06F 3/041* (2006.01)
*H10K 59/40* (2023.01)

(52) U.S. Cl.
CPC .......... *G06F 3/0412* (2013.01); *G06F 3/0416* (2013.01); *G06F 3/04166* (2019.05); *G06F 3/044* (2013.01); *H10K 59/40* (2023.02); *G09G 2300/0819* (2013.01); *G09G 2310/08* (2013.01)

(58) Field of Classification Search
CPC .. G06F 3/0412; G06F 3/0416; G06F 3/04164; G06F 3/04166; G06F 3/044; G09G 3/20; G09G 2300/0426; G09G 2300/0819; G09G 2310/08; H01L 27/156; H10K 59/40

See application file for complete search history.

(56) References Cited

U.S. PATENT DOCUMENTS

2020/0321387 A1* 10/2020 Jang .................. H01L 27/14609
2020/0342196 A1* 10/2020 Chang .................. G09G 3/3688

FOREIGN PATENT DOCUMENTS

JP        2008052111 A  *  3/2008

* cited by examiner

*Primary Examiner* — Julie Anne Watko
(74) *Attorney, Agent, or Firm* — MUNCY, GEISSLER, OLDS & LOWE, P.C.

(57) ABSTRACT

An electronic device includes a signal readout line and a sensor component electrically connected to the signal readout line. The sensor component includes a pixel sensor and a sensor pad. The pixel sensor includes a first transistor, a first capacitor and a second transistor. The first transistor includes a first terminal, a second terminal, and a first control terminal. The first capacitor is electrically connected to the first control terminal and the second terminal. The second transistor includes a third terminal, a fourth terminal and a second control terminal. The fourth terminal is electrically connected to the signal readout line. The sensor pad is electrically connected to the second terminal. The pixel sensor includes a third transistor including a fifth terminal, a sixth terminal and a third control terminal. The third control terminal is electrically connected to the second terminal. The sixth terminal is electrically connected to the third terminal.

18 Claims, 8 Drawing Sheets

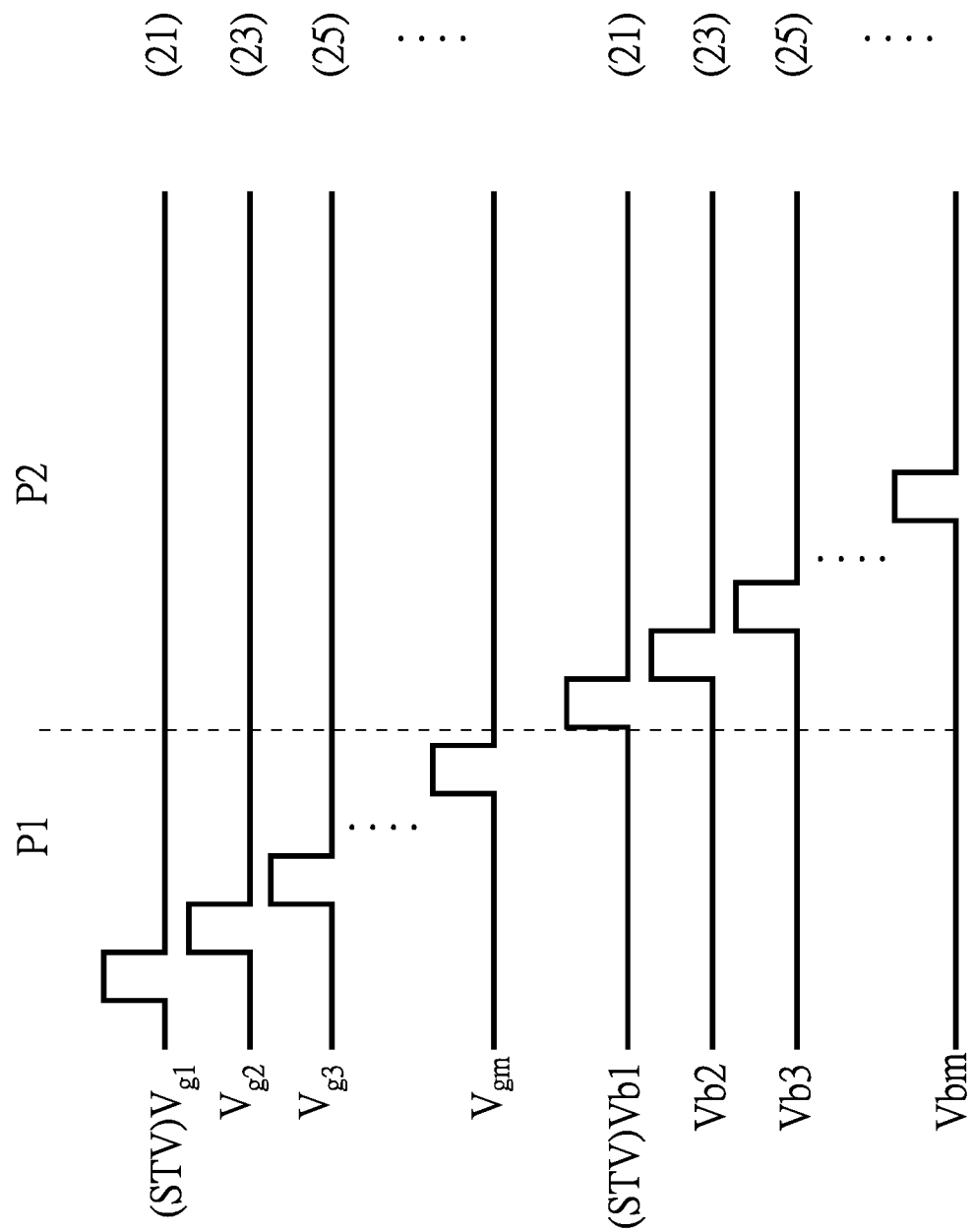

ELECTRONIC DEVICE

CROSS REFERENCE TO RELATED APPLICATION

This application claims the benefits of the Chinese Patent Application Serial Number 202110188475.8, filed on Feb. 19, 2021, the subject matter of which is incorporated herein by reference.

BACKGROUND

1. Field of the Disclosure

The present disclosure relates to an electronic device and, more particularly, to an electronic device with pixel sensors.

2. Description of Related Art

With the development of science and technology, the in-cell technology that embeds touch functions into pixels of electronic devices has been widely used. In addition, as the resolution of the display screen is increasing, the user's demand for touch resolution (distribution density of touch points) is gradually increasing.

However, in order to achieve a high-resolution touch experience, a larger number of touch ICs and a more complicated and large wiring configuration are required in the circuit design, which not only complicates the circuit design, but also causes an increase in costs.

Therefore, it is desirable to provide an improved electronic device to mitigate and/or obviate the aforementioned problems.

SUMMARY

The present disclosure provides an electronic device, which includes a signal readout line and a sensor component. The sensor component is electrically connected to the signal readout line, and includes a pixel sensor and a sensor pad. The pixel sensor includes a first transistor, a first capacitor, and a second transistor. The first transistor includes a first terminal, a second terminal, and a first control terminal. The first capacitor is electrically connected to the first control terminal and the second terminal. The second transistor includes a third terminal, a fourth terminal and a second control terminal, wherein the fourth terminal is electrically connected to the signal readout line. The sensor pad is electrically connected to the second terminal.

From the following detailed description in conjunction with the accompanying drawings, other novel features of the present disclosure will become clearer.

BRIEF DESCRIPTION OF THE DRAWINGS

FIG. 10 is a signal timing diagram of the sensor component array of the embodiment shown in FIG. 9.

DETAILED DESCRIPTION OF EMBODIMENT

Figure 1:
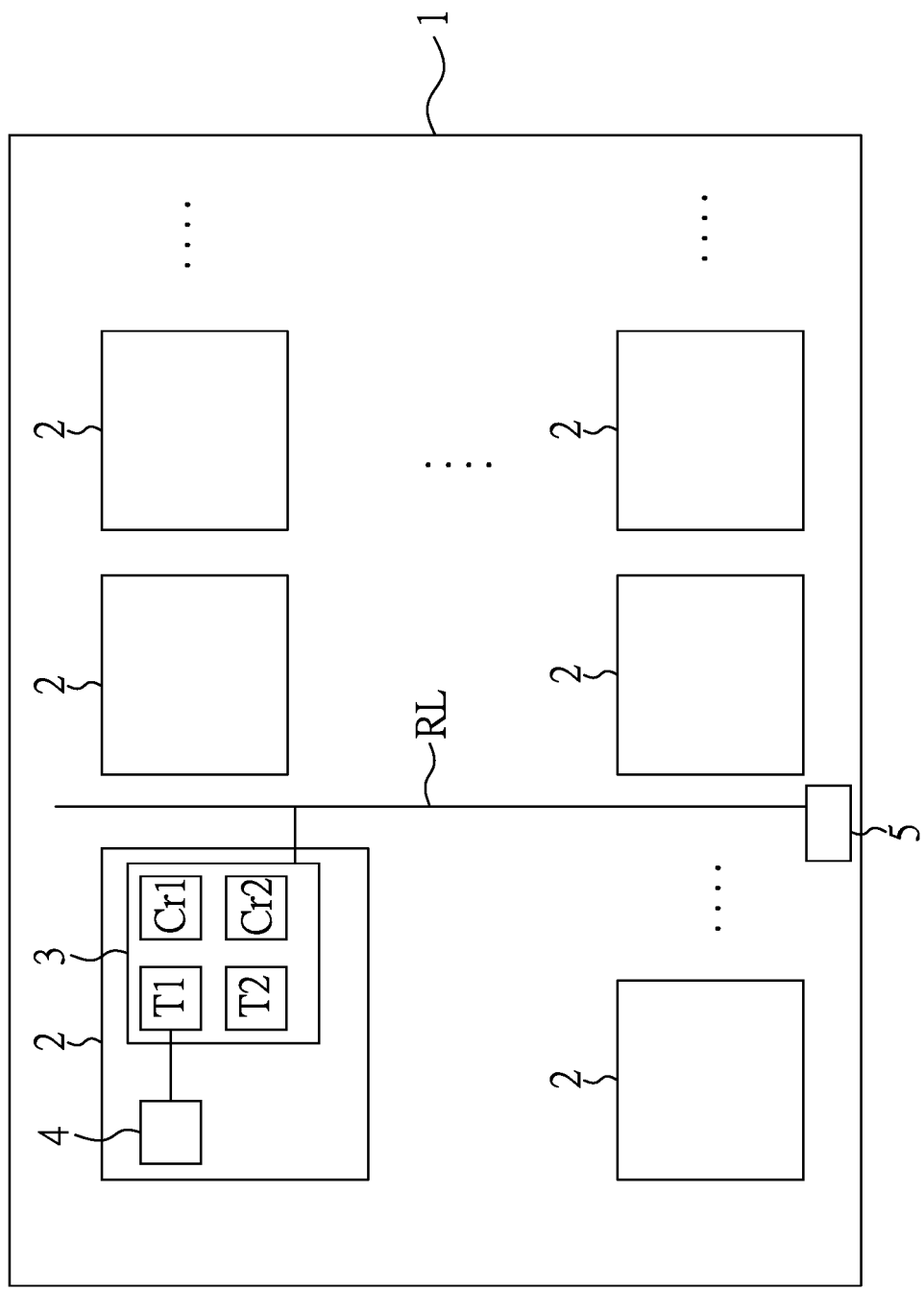
FIG. 1 is a schematic diagram of the electronic device according to an embodiment of the present disclosure.

When read in conjunction with the accompanying drawings, the following embodiments are used to clearly demonstrate the above and other technical content, features and/or effects of the present disclosure. Through the description of the specific embodiments, those skilled in the art will further understand the technical means and effects used in the present disclosure to achieve the aforementioned purpose. In addition, since the content disclosed in the present disclosure should be easy to understand and can be implemented by those skilled in the art, all equivalent replacements or modifications that do not depart from the concept of the present disclosure should be involved in the claims.

It should be noted that, in the specification and claims, unless otherwise specified, having "one" component is not limited to having a single said component, but one or more said components may be provided.

In addition, in the specification and claims, unless otherwise specified, ordinal numbers, such as "first" and "second", used herein are intended to distinguish components rather than disclose explicitly or implicitly that names of the components bear the wording of the ordinal numbers. The ordinal numbers do not imply what order a component and another component are in terms of space, time or steps of a manufacturing method. A "first" component and a "second" component may appear together in the same component, or separately in different components. The existence of a component with a larger ordinal number does not necessarily mean the existence of another component with a smaller ordinal number.

In addition, the term "adjacent" in the specification and claims is used to describe mutual proximity, and does not necessarily mean mutual contact.

In addition, the description of "when . . . " or "while . . . " in the present disclosure means "now, before, or after", etc., and is not limited to occurrence at the same time. In the present disclosure, the similar description of "disposed on" or the like refers to the corresponding positional relationship between the two components, and does not limit whether there is contact between the two components, unless specifically limited. Furthermore, when the present disclosure recites multiple effects, if the word "or" is used between the effects, it means that the effects can exist independently, but it does not exclude that multiple effects can exist at the same time.

In addition, the term "connect" or "couple" is intended not only directly connect with other component, but also intended indirectly connect and electrically connect with other component. Besides, electrical connection includes direct connection, indirect connection, or wireless communication between two components.

In addition, in the specification and claims, the terms "almost", "about", "approximately" or "substantially" usually means within 10%, 5%, 3%, 2%, 1% or 0.5% of a given value or range. The quantity given here is an approximate quantity; that is, without specifying "almost", "about", "approximately" or "substantially", it can still imply the meaning of "almost", "about", "approximately" or "substantially". In addition, the term "range of the first value to the second value" or "range between the first value and the second value" indicates that the range includes the first value, the second value, and other values in between.

In addition, the technical features of the different embodiments disclosed in the present disclosure can be combined to form another embodiment.

In addition, the electronic device disclosed in the present disclosure may include a display device, an antenna device, a sensing device, a touch display device, a curved display device, or a free shape display device, but is not limited thereto. The electronic device may be a bendable or flexible electronic device. The electronic device may include, for example, liquid crystal, light emitting diode, fluorescence, phosphor, other suitable display media, or a combination thereof, but is not limited thereto. The light emitting diode may include, for example, an organic light emitting diode (OLED), a sub-millimeter light emitting diode (mini LED), a micro light emitting diode (micro LED) or a quantum dot (QD) light emitting diode (for example, QLED, QDLED) or other suitable materials or a combination thereof, but is not limited thereto. The display device may include, for example, a tiled display device, but is not limited thereto. The antenna device may be, for example, a liquid crystal antenna, but is not limited thereto. The antenna device may include, for example, a tiled antenna device, but is not limited thereto. It should be noted that the electronic device may be a combination of the foregoing, but is not limited thereto. In addition, the appearance of the electronic device may be rectangular, circular, polygonal, a shape with curved edges, or other suitable shapes. The electronic device may have peripheral systems such as a driving system, a control system, a light source system, a shelf system, etc., to support a display device, an antenna device, or a tiled device. Hereinafter, the display device will be used as an electronic device for illustrative purpose only, but the disclosure is not limited thereto.

FIG. 1 is a schematic diagram of the electronic device 1 according to an embodiment of the present disclosure. As shown in FIG. 1, the electronic device 1 includes at least one signal readout line RL and a sensor component 2. The sensor component 2 at least includes a pixel sensor 3 and a sensor pad 4, wherein the pixel sensor 3 at least includes a first transistor T1, a first capacitor Cr1, and a second transistor T2. The sensor pad 4 is electrically connected to the pixel sensor 3. The signal readout line RL can output signals to a reading chip 5. The sensor component 2 can be used to sense whether there is a touch action or not.

Figure 2:
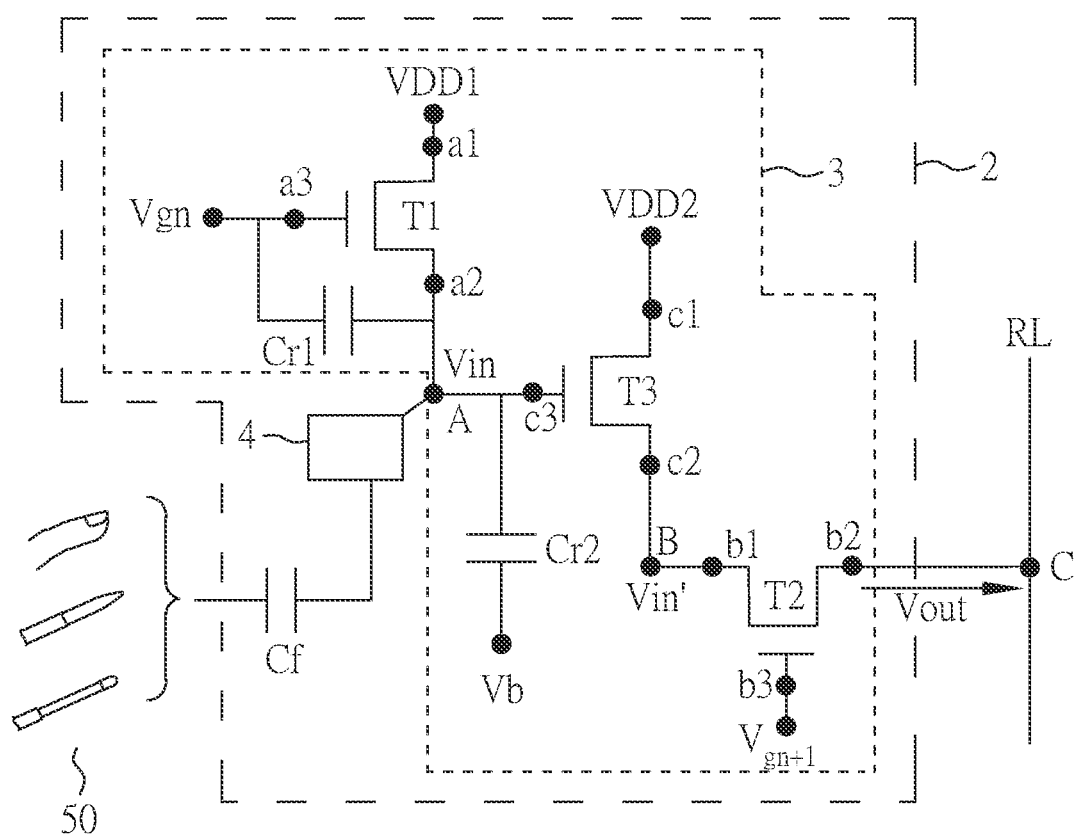
FIG. 2 is a circuit diagram of the sensor component according to the first embodiment of the present disclosure.

FIG. 2 is a circuit diagram of the sensor component 2 according to the first embodiment of the present disclosure. With reference to FIG. 2 as well as FIG. 1, the sensor component 2 is electrically connected to the signal readout line RL, and the pixel sensor 3 of the sensor component 2 includes a first transistor T1, a second transistor T2, a third transistor T3, a first capacitor Cr1 and a second capacitor Cr2.

The first transistor T1 includes a first terminal a1, a second terminal a2, and a first control terminal a3. In one embodiment, the first terminal a1 is the drain or source of the first transistor T1, the second terminal a2 is the source or drain of the first transistor T1, and the first control terminal a3 is the gate of the first transistor T1. The first terminal a1 can be electrically connected to a first voltage VDD1, the second terminal a2 can be electrically connected to the third transistor T3, and the first control terminal a3 can be electrically connected to a first control signal Vgn. In one embodiment, the first transistor T1 is a reset transistor of the pixel sensor 3, which is used to reset the signal on each node of the pixel sensor 3 in various working stages (for example, when finishing a frame display). However, the effect of the first transistor T1 is not limited to this.

The second transistor T2 includes a third terminal b1, a fourth terminal b2, and a second control terminal b3. In one embodiment, the third terminal b1 is the drain or source of the second transistor T2, the fourth terminal b2 is the source or drain of the second transistor T2, and the second control terminal b3 is the gate of the second transistor T2. The third terminal b1 can be electrically connected to the third transistor T3 at node B, the second control terminal b3 can be electrically connected to a second control signal Vgn+1, and the fourth terminal b2 can be electrically connected to the signal readout line RL at node C. Therefore, the fourth terminal b2 can output an output signal Vout to the signal readout line RL, so that the output signal Vout can be measured at node C, and the output signal Vout can be transmitted to a reading chip 5 through the signal readout line RL.

The third transistor T3 includes a fifth terminal c1, a sixth terminal c2, and a third control terminal c3. In one embodiment, the fifth terminal c1 is the drain or source of the third transistor T3, the sixth terminal c2 is the source or drain of the third transistor T3, and the third control terminal c3 is the gate of the third transistor T3. The fifth terminal c1 can be electrically connected to a second voltage VDD2, the sixth terminal c2 can be electrically connected to the third terminal b1, and the third control terminal c3 can be electrically connected to the second terminal a2.

One end of the first capacitor Cr1 is electrically connected to the first control terminal a3, and the other end of the first capacitor Cr1 is electrically connected to the second terminal a2. One end of the second capacitor Cr2 is electrically connected to the second terminal a2, and the other end of the second capacitor Cr2 is electrically connected to a bias signal Vb. In one embodiment, when the first transistor T1 is turned on, a first node signal Vin will be generated on the second terminal a2, and the voltage value of the first node signal Vin is between the first voltage VDD1 and the bias signal Vb based on a capacitance ratio of the first capacitor Cr1 to the second capacitor Cr2.

In one embodiment, the capacitance value of the second capacitor Cr2 may be greater than or equal to the capacitance value of the first capacitor Cr1 (that is, Cr2≥Cr1). By adjusting the ratio of the second capacitor Cr2 to the first capacitor Cr1, a higher touch sensitivity can be achieved. For example, in one embodiment, the second capacitor Cr2 may be 2 to 4 times the first capacitor Cr1 (that is, 2≤Cr2/Cr1≤4). In one embodiment, the second capacitor Cr2 may be 3 to 3.5 times the first capacitor Cr1 (that is, 3≤Cr2/Cr1≤3.5). In one embodiment, the second capacitor Cr2 may be 3.25 times the first capacitor Cr1 (that 3.25=Cr2/Cr1), but the present disclosure is not limited thereto.

As shown in FIG. 2, the sensor pad 4 and the second terminal a2 are electrically connected at node A. In one embodiment, the material of the sensor pad 4 may include conductive metal material, conductive film (such as transparent conductive film (indium tin oxide, hereinafter referred to as ITO)), other suitable materials, or a combination thereof, and is not limited thereto. In one embodiment, when an object approaches or contacts a sensor component 2 of the electronic device 1 (such as a display device), a third capacitor Cf will be generated between the object and the sensor pad 4. Due to the existence of the third capacitor Cf, the voltage value of the first node signal Vin on the second terminal a2 will be affected and changed by the third capacitor Cf, thereby changing the voltage value of the output signal (Vout). Therefore, the reading chip 5 may determine whether a touch occurs and the position of the touch based on the change of the output signal (Vout). The details of the detection process will be explained in more detail in subsequent paragraphs.

It is noted that, in one embodiment, even though a parasitic capacitor may be generated when the first transistor T1 is turned on, the pixel sensor 3 still needs to include the first capacitor Cr1, which means that the parasitic capacitor cannot directly replace the first capacitor Cr1. The reason is that the capacitance value of the parasitic capacitor is more susceptible to the material stacked structure, and thus is difficult to control. In addition, the capacitance value of the parasitic capacitor is generally low. When the parasitic capacitor is used in conjunction with the second capacitor Cr2 or the third capacitor Cf, the capacitance value of the parasitic capacitor is much lower than the capacitance value of the second capacitor Cr2 or the third capacitor Cf, and thus it is likely to be ignored or is difficult to read.

Figure 3:
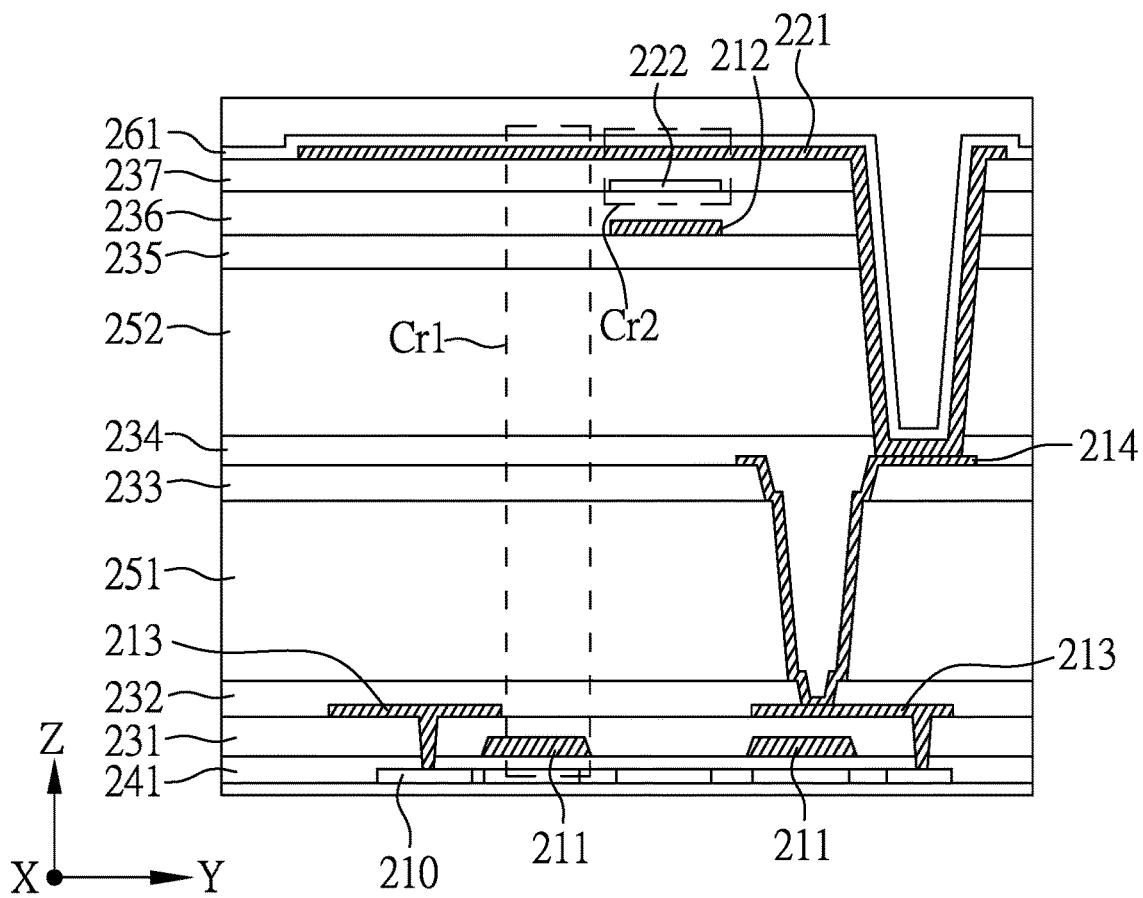
FIG. 3 is a cross-sectional view of a partial stacked structure of the electronic device according to the first embodiment of the present disclosure.

Next, FIG. 3 is provided to describe the stacked structure feature of the electronic device 1, and please refer to FIG. 1 to FIG. 2 at the same time.

As shown in FIG. 3, when the electronic device 1 is observed from the cross-sectional view, the electronic device 1 may include a first conductive layer 211, a second conductive layer 212, a first electrode layer 221, and a second electrode layer 222. In one embodiment, the first conductive layer 211 may be used as a gate electrode or gate line of a transistor, the first electrode layer 221 may be used as a touch electrode (that is, the sensor pad 4 in FIG. 2) or a common electrode, the second electrode layer 222 may be used as a pixel electrode, and the first electrode layer 221 and/or the second electrode layer 222 may be an ITO layer, but the present disclosure is not limited thereto. The first electrode layer 221 and the first conductive layer 211 at least partially overlap each other to form a first capacitor Cr1. For example, in one embodiment, the first capacitor Cr1 includes the overlapping portion of the first electrode layer 221 and the first conductive layer 211, between which no other conductive layers exist. In one embodiment, the first electrode layer 221 and the second electrode layer 222 at least partially overlap each other to form the second capacitor Cr2. More specifically, the second capacitor Cr2 may include the overlapping portion of the first electrode layer 221 and the second electrode layer 222, between which no other conductive layers exist. It is noted that, in some embodiments, the electronic device 1 may not include the second electrode layer 222. In such a case, the second capacitor Cr2 may include the overlapping portion of the second conductive layer 212 and the first electrode layer 221. In addition, when the first conductive layer 211 is used as a gate line that extends in one direction (for example, the X direction in FIG. 3), the portion of the first conductive layer 211 that overlaps the first electrode layer 221 and does not overlap other conductive layers therebetween may also be used as portion of the first capacitor Cr1.

As shown in FIG. 3, in the display direction (for example, the Z direction) of the electronic device 1, the gate insulating layer 241 is disposed on the semiconductor layer 210, and the first conductive layer 211 and a first insulating layer 231 are disposed on the gate insulating layer 241. A third conductive layer 213 and a second insulating layer 232 are disposed on the first insulating layer 231, wherein the semiconductor layer 210, the first conductive layer 211, a third conductive layer 213, and portion of the gate insulating layer 241 at the corresponding position may form a transistor, and the first conductive layer 211 may be used as a gate of the transistor. A first photoresist layer 251 is disposed on the second insulating layer 232. A third insulating layer 233 is disposed on the first photoresist layer 251. A fourth insulating layer 234 and a fourth conductive layer 214 are disposed on the third insulating layer 233, and the fourth conductive layer 214 penetrates through the third insulating layer 233, the first photoresist layer 251, and the second insulating layer 232 to be electrically connected to the third conductive layer 213. A second photoresist layer 252 is disposed on the fourth insulating layer 234. A fifth insulating layer 235 is disposed on the second photoresist layer 252. A sixth insulating layer 236 and a second conductive layer 212 are disposed on the fifth insulating layer 235. A seventh insulating layer 237 and a second electrode layer 222 are disposed on the sixth insulating layer 236. An alignment film layer 261 and the first electrode layer 221 are disposed on the seventh insulating layer 237, and the first electrode layer 221 penetrates the seventh insulating layer 237, the sixth insulating layer 236, the fifth insulating layer 235 and the second photoresist layer 252 to be electrically connected to the fourth conductive layer 234. The aforementioned example is the stacked situation shown in the cross-section of an embodiment of the present disclosure, but the present disclosure is not limited thereto. It is be noted that, in the embodiment shown in FIG. 3, the first photoresist layer 251 and the second photoresist layer 252 may have an insulating function, but their materials and thicknesses may be different from those of other insulating layers. For example, in one embodiment, the first photoresist layer 251 and the second photoresist layer 252 may be organic dielectric layers that do not contain oxides, and their thickness is relatively thick to serve as a flat layer, while other insulating layers may contain an oxide component, but the present disclosure is not limited thereto. Accordingly, the stacked structure feature of the sensor component 2 can be understood.

Figure 4:
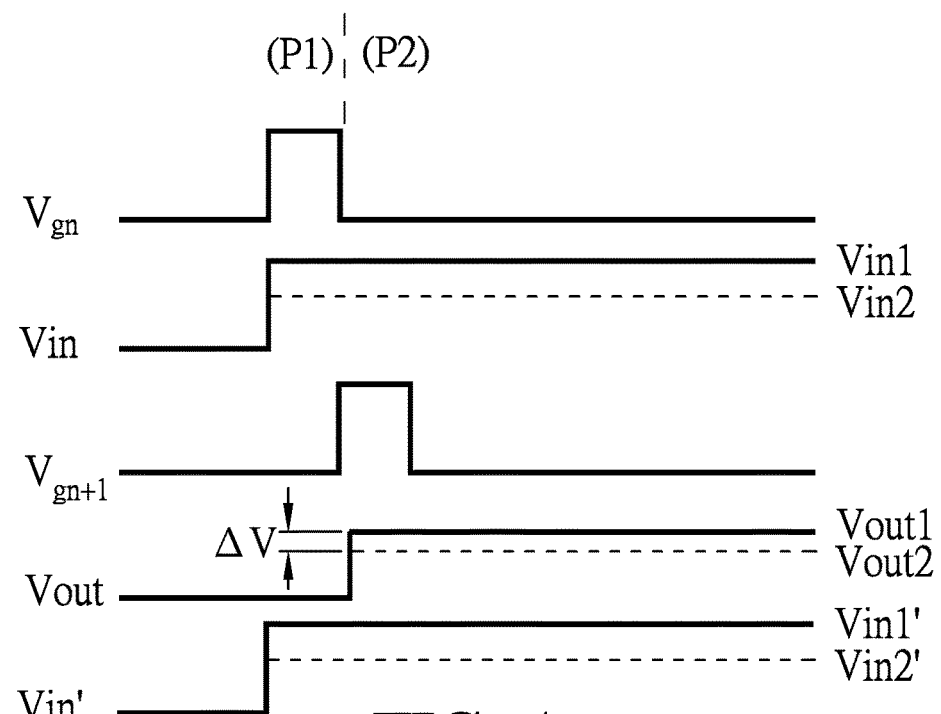
FIG. 4 is a signal timing diagram of the sensing component according to the first embodiment of the present disclosure.

Next, the operation process of the sensor component 2 will be described. FIG. 4 is a signal timing diagram of the sensor component 2 according to the first embodiment of the present disclosure, and please refer to FIGS. 1 to 3 at the same time.

As shown in FIGS. 2 and 4, in a first operation stage P1 (that is, the initial stage), the first control signal Vgn is a high voltage, and the first transistor T1 is turned on. Since the first terminal a1 is connected to the first voltage VDD1, the first voltage VDD1 charges the second terminal a2, so that the voltage value of the first node signal Vin at the second terminal a2 is increased from an initial value (for example, zero voltage) to a first voltage value Vin1. When the first voltage value Vin1 is greater than the threshold voltage of the third transistor T3, the third transistor T3 is also turned on, and the second voltage VDD2 charges the sixth terminal c2 (equivalent to the third terminal b1), thereby causing the voltage value of a second node signal Vin' on the sixth terminal c2 to be raised to a third voltage value Vin1'. In addition, in the first operation stage P1, the bias signal Vb has a fixed value, and thus the first voltage value Vin1 is mainly affected by the first capacitor Cr1 and the second capacitor Cr2. In addition, the second control signal Vgn+1 is a low voltage, and thus the second transistor T2 is turned off.

Then, in a second operation stage P2 (following the first operation stage P1), the first control signal Vgn is changed to a low voltage, the first transistor T1 is turned off, and the second control signal Vgn+1 is changed from a low voltage to a high voltage, so that the second transistor T2 is turned on and the output signal Vout is outputted to the signal readout line RL. In the case of no touch, the voltage value of the output signal Vout is defined as a first output value Vout1.

In the second operation stage P2, when an object contacts the touch area of the electronic device 1 (that is, when a touch occurs), a third capacitance Cf is generated between the object and the sensor pad 4 and, at this moment, the voltage value of the first node signal Vin of the second terminal a2 will be affected by the first capacitor Cr1, the second capacitor Cr2, and the third capacitor Cf to be converted into a second voltage value Vin2. Since the first node signal Vin inputted to the third control terminal c3 is changed from the first voltage value Vin1 to the second voltage value Vin2, the current flowing through the third transistor T3 is also changed, so that the voltage value of the second node signal Vin' on the sixth terminal c2 (that is, the third terminal b1) will be also changed to a fourth voltage value Vin2'. As the voltage value of the second node signal Vin' is changed, the voltage value of the output signal Vout is also changed from the first output value Vout1 to a second output value Vout2. At this moment, the reading chip 5 may determine whether a touch occurs and the position of the touch based on whether a difference $\Delta V1$ between the second output value Vout2 and the first output value Vout1 (that is, $\Delta V1=Vout1-Vout2$) satisfies a touch determination threshold $\Delta Vt$ (for example, $\Delta V1 \geq \Delta Vt$).

More specifically, in one embodiment, when there is no touch, the first voltage value Vin1 of the second terminal a2 is affected by the first capacitor Cr1 and the second capacitor Cr2, and thus the first voltage value Vin1 may be expressed as the following formula:

$$Vin1=(Cr1/(Cr1+Cr2))\times Vgn,$$

where Vin1 is the first voltage value, Cr1 is the capacitance value of the first capacitor Cr1, Cr2 is the capacitance value of the second capacitor Cr2, and Vgn is the first control signal.

In one embodiment, when a touch occurs, the second voltage value Vin2 of the second terminal a2 is affected by the first capacitor Cr1, the second capacitor Cr2, and the third capacitor Cf, and thus the second voltage value Vin2 may be expressed as the following formula:

$$Vin2=(Cr1/(Cr1+Cr2+Cf))\times Vgn,$$

where Vin2 is the second voltage value, and Cf is the capacitance value of the third capacitor.

In one embodiment, the difference (Vin1−Vin2) between the first voltage value Vin1 and the second voltage value Vin2 may be substantially equal to the difference (Vin1'−Vin2') between the third voltage value Vin1' and the fourth voltage value Vin2', but it is not limited thereto.

In one embodiment, the first voltage VDD1, the second voltage VDD2, and the bias signal Vb may be the same or different DC signals and, when two of them are the same DC signal, the two may be from the same signal source or the same signal trace, but the present disclosure is not limited thereto. In one embodiment, the first control signal Vgn and the second control signal Vgn+1 may be AC signals with different timings, but it is not limited thereto. For example, in some embodiments, the first voltage VDD1, the second voltage VDD2 or the bias signal Vb may be an AC signal.

As a result, the operation process of the sensor component 2 can be understood, and the sensor component 2 formed by integrating the sensor pad 4 and the pixel sensor 3 can be realized.

Figure 5:
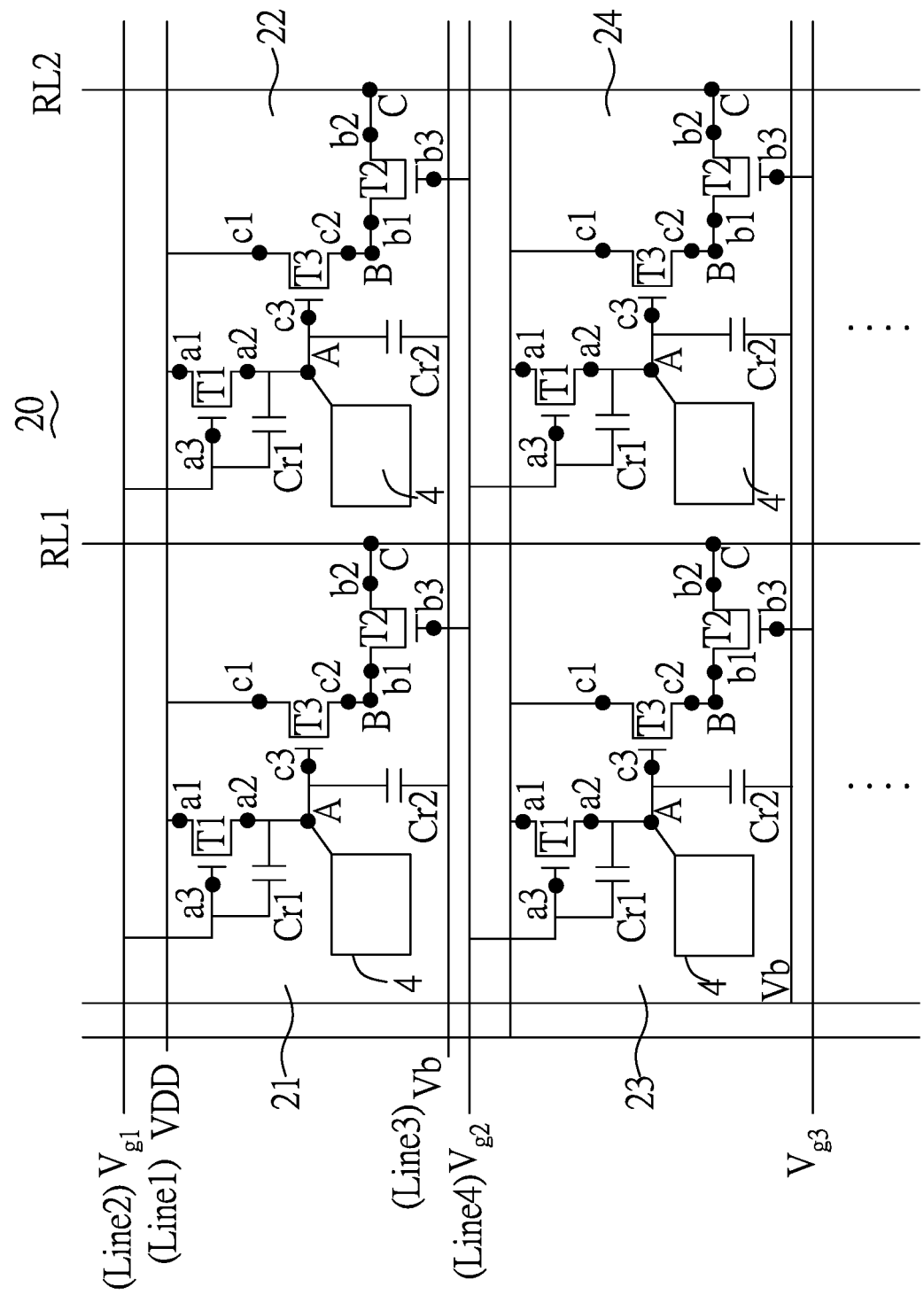
FIG. 5 is a schematic diagram illustrating the structure of the sensor component array according to the first embodiment of the present disclosure.

In addition, a plurality of sensor components 2 may constitute an array structure 20. FIG. 5 is a schematic diagram illustrating the structure of the sensor component array 20 according to the first embodiment of the present disclosure, and please refer to FIGS. 1 to 4 at the same time. For the convenience of description, FIG. 5 shows an example that the sensor component array 20 includes four sensor components 2 (such as sensor component 21, sensor component 22, sensor component 23 and sensor component 24) with the same structure. In addition, although the sensor component array 20 of the embodiment in FIG. 5 has a rectangular shape, the present disclosure is not limited thereto.

As shown in FIG. 5, the first terminal a1 of the sensor component 21 and the first terminal a1 of the sensor component 22 are connected to a first signal line Line1 at the same time, and each receives a voltage VDD from the first signal line Line1 for use as its own first voltage VDD1. The first control terminal a3 of the sensor component 21 and the first control terminal a3 of the sensor component 22 are connected to a second signal line Line2 at the same time, and each receives a control signal Vg1 from the second signal line Line2 for use as its own first control signal Vgn (labeled in FIG. 2). The second capacitor Cr2 of the sensor component 21 and the second capacitor Cr2 of the sensor component 22 are connected to a third signal line Line3 at the same time, and each receives the bias signal Vb from the third signal line Line3. The fifth terminal c1 of the sensor component 21 and the fifth terminal c1 of the sensor component 22 are connected to a first signal line Line1 at the same time, and each receives the voltage VDD from the first signal line Line1 for use as its own second voltage VDD2 (that is, in the embodiment of FIG. 5, the first voltage VDD1 and the second voltage VDD2 are equal, but the present disclosure is not limited thereto). The second control terminal b3 of the sensor component 21 and the second control terminal b3 of the sensor component 22 are electrically connected to a fourth signal line Line4 at the same time, and each receives a control signal Vg2 from the fourth signal line Line4 for use as its own second control signal Vgn+1 (labeled in FIG. 2).

In addition, the first control terminal a3 of the sensor component 23 and the first control terminal a3 of the sensor component 24 may be connected to the fourth signal line Line4 at the same time, and each receives the control signal Vg2 from the fourth signal line Line4 for use as its own first control signal Vgn (labeled in FIG. 2).

In addition, the fourth terminal b2 of the sensor component 21 and the fourth terminal b2 of the sensor component 23 may be connected to a first signal readout line RL1 at the same time, and each outputs an output signal Vout (labeled in FIG. 2) through the first signal readout line RL1. Similarly, the fourth terminal b2 of the sensor component 22 and the fourth terminal b2 of the sensor component 24 may be connected to a second signal readout line RL2 at the same time, and each outputs an output signal Vout (labeled in FIG. 2) through the second signal readout line RL2. The rest may be deduced by analogy with reference to FIG. 5.

It can be seen that the sensor components 2 in the sensor component array 20 of the present disclosure may share the signal readout line RL and thus, in comparison with the prior art, the number of signal lines required by the present disclosure will be greatly reduced.

Figure 6:
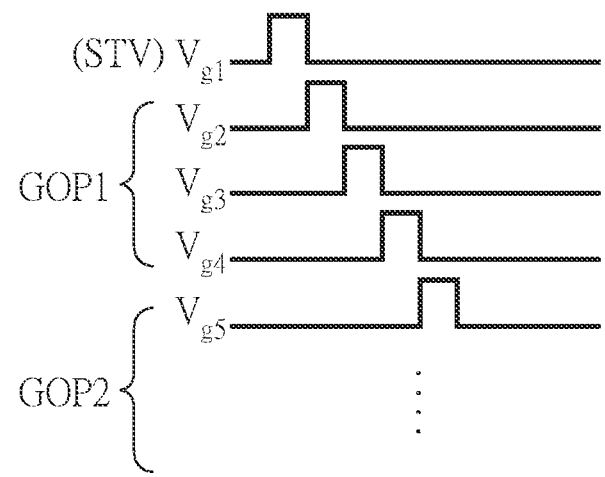
FIG. 6 is a signal timing diagram of the sensor component array of the embodiment shown in FIG. 5.

FIG. 6 is a signal timing diagram of the sensor component array of the embodiment shown in FIG. 5. As shown in FIG. 5 and FIG. 6, a plurality of control signals (such as Vg1~Vg5) are sequentially changed to a high voltage at different time points. The sensor components (such as sensor components 21 and 22) in the first row of the sensor component array 20 use the first one of control signals Vg1 as their first control signal Vgn (labeled in FIG. 2), and use the second one of control signals Vg2 as their own second control signal Vgn+1 (labeled in FIG. 2). The sensor components in the second row of the sensor component array 20 (such as the sensor components 23 and 24) use the second one of control signals Vg2 as their first control signal Vgn (labeled in FIG. 2), and use the third control signal Vg3 as their second control signal Vgn+1 (labeled in FIG. 2). The rest may be deduced by analogy with reference to FIG. 6. It can be seen from FIG. 5 that, since the first control terminals a3 of the sensor components 23 and 24 and the second control terminals b3 of the sensor components 21 and 22 are electrically connected to the fourth signal line Line4 at the same time, when the first transistors T1 of the sensor components (for example, sensor components 23, 24) are turned on, the first transistors T2 of the sensor components (for example, sensor components 21, 22) of the previous row are also turned on to output the output signal Vout (labeled in FIG. 2). In addition, in one embodiment, the first one of control signals Vg1 may be from a start pulse signal STV, part of the control signals (for example, Vg2~Vg4) may be from a signal source (for example, a gate controller GOP1), and part of the control signal (for example, Vg5) may be from another signal source (for example, another gate controller GOP2), but it is not limited thereto.

In addition, although the sensor components of different rows in the embodiment of FIG. 5 share part of the signal lines, for example, the second control terminals b3 of the sensor components 21 and 22 and the first control terminals a3 of the sensor components 23 and 24 share the fourth signal line Line4, the sensor components 2 of different rows may also be connected to different signal lines in other embodiments. At this moment, the control signals corresponding to the sensor components 2 of the same row in FIG. 6 may also be adjusted accordingly.

As a result, the structure and operation of the sensor component array 20 of the first embodiment can be understood.

Figure 7:
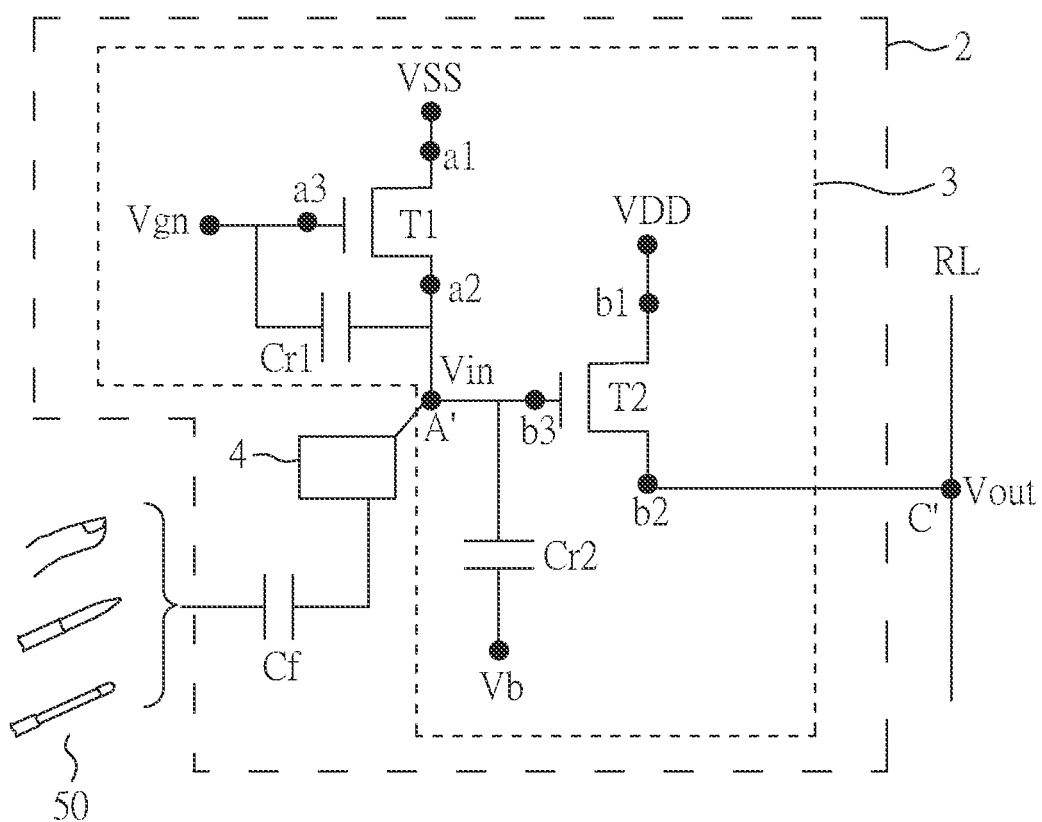
FIG. 7 is a circuit diagram of the sensor component according to the second embodiment of the present disclosure.

The sensor component 2 of the present disclosure may also have different implementations. FIG. 7 is a circuit diagram of the sensor components 2 according to the second embodiment of the present disclosure, and please refer to FIGS. 1 to 6 at the same time.

As shown in FIG. 7, the sensor component 2 of the second embodiment is electrically connected to the signal readout line RL. The sensor component 2 also includes a pixel sensor 3 and a sensor pad 4, and the pixel sensor 3 includes a first transistor T1, a second transistor T2, a first capacitor Cr1, and a second capacitor Cr2. The part of the second embodiment similar to the first embodiment can be known from the content of the first embodiment, so that the following description mainly focuses on the different points.

In the second embodiment, the first terminal a1 of the first transistor T1 is electrically connected to a voltage VSS, the third terminal b1 of the second transistor T2 is electrically connected to a voltage VDD, and the second control terminal b3 of the second transistor T2 is electrically connected to the second terminal a2 of the first transistor T1. For example, the second control terminal b3 is electrically connected to the second terminal a2 of the first transistor T1 through the node A'. In addition, the bias signal Vb may have different voltages at different time points. The fourth terminal b2 of the second transistor T2 may be electrically connected to the signal readout line RL at the node C'.

Figure 8:
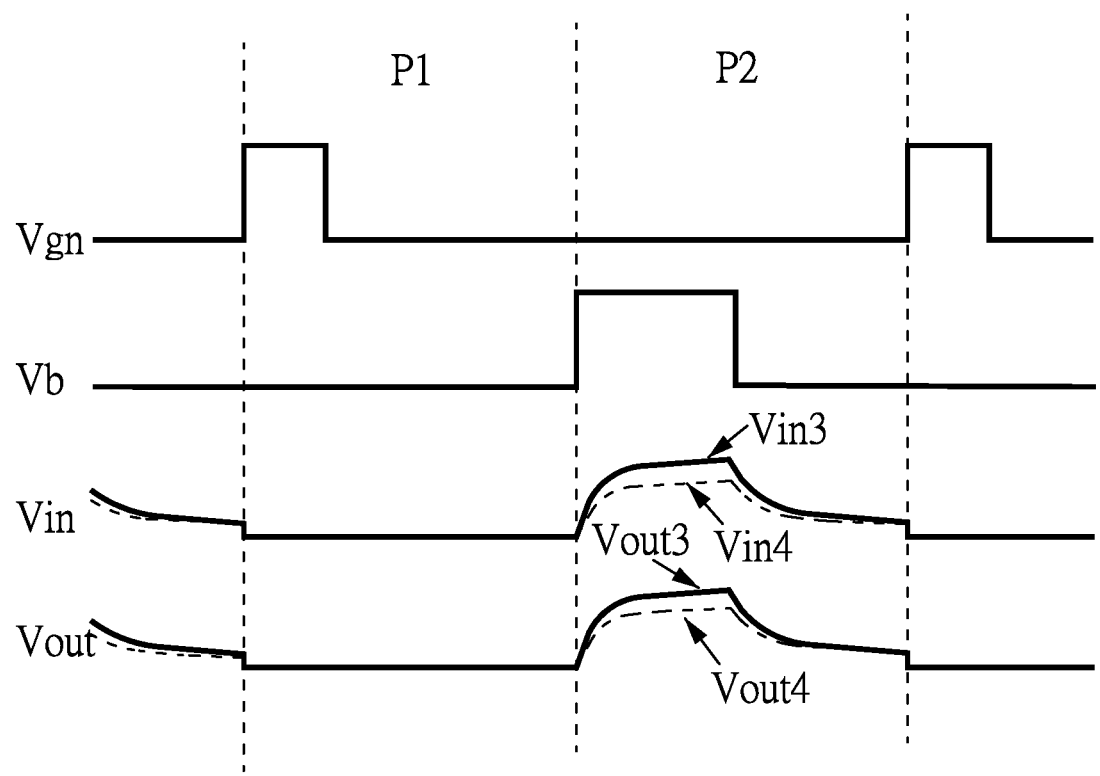
FIG. 8 is a signal timing diagram of the sensor component according to the second embodiment of the present disclosure.

Next, the operation process of the sensor component 2 of the second embodiment will be described. FIG. 8 is a signal timing diagram of the sensor component 2 according to the second embodiment of the present disclosure, and please refer to FIGS. 1 to 7 at the same time.

As shown in FIG. 7 and FIG. 8, in a first operation phase P1, the first control signal Vgn is a high voltage, and thus the first transistor T1 is turned on and the bias signal Vb is a low voltage at this moment. Since the first terminal a1 is connected to the voltage VSS, the first node signal Vin at the second terminal a2 is also coupled to an initial voltage value (for example, zero voltage).

Prior to a second operation phase P2, the first control signal Vgn is changed to a low voltage. This turns off the first transistor T1. In the second operation phase P2, the first control signal Vgn remains at a low voltage. Thus, the first transistor T1 remains turned off. As second operation phase P2 begins, the bias signal Vb is changed from a low voltage to a high voltage to charge the second terminal a2, so that the first node signal Vin at the second terminal a2 is increased to a fifth voltage value Vin3. When the fifth voltage value Vin3 reaches (for example, being greater than or equal to) the threshold voltage of the second transistor T2, the second transistor T2 may be turned on, and the fourth terminal b4 may output the output signal Vout to the signal readout line RL, so that the output signal Vout can be measured at node C'. In one embodiment, when there is no touch, the voltage value of the output signal is defined as a third output value Vout3. In one embodiment, the fifth voltage value Vin3 is affected by the first capacitor Cr1 and the second capacitor Cr2, and can be expressed as the following formula:

$$Vin3=(Cr2/(Cr1+Cr2))\times Vb,$$

where Vin3 is the fifth voltage value, and Vb is the voltage value of the bias signal Vb.

In addition, in one embodiment, in the second operation stage P2, when a touch occurs, a third capacitor Cf is formed between an object (for example, a finger) and the sensor pad 4. At this moment, the first node signal Vin of the second terminal a2 will be affected by the first capacitor Cr1, the second capacitor Cr2 and the third capacitor Cf, and the voltage value of the first node signal Vin will be changed from the fifth voltage value Vin3 to a sixth voltage value Vin4, so that the voltage value of the output signal Vout is changed from the third output value Vout3 to a fourth output value Vout4. Therefore, the reading chip 5 may determine whether a touch occurs and the position of the touch according to whether a difference ΔV2 between the third output value Vout3 and the fourth output value Vout4 (that is, ΔV2=Vout3−Vout4) satisfies a touch determination threshold ΔVt (for example, ΔV2≥ΔVt). In one embodiment, the sixth voltage value Vin4 is affected by the first capacitor Cr1, the second capacitor Cr2, and the third capacitor Cf, and may be expressed as the following formula:

$$Vin4=(Cr2/(Cr1+Cr2+Cf))\times Vb,$$

where Vin4 is the sixth voltage value.

In one embodiment, the voltage VDD and the voltage VSS may be different DC signals, and thus may be from different signal sources, but the present disclosure is not limited thereto. In one embodiment, the first control signal Vgn and the bias signal Vb may be AC signals with different timings, but the present disclosure is not limited thereto. Accordingly, the operation process of the sensor component 2 of the second embodiment can be understood.

Figure 9:
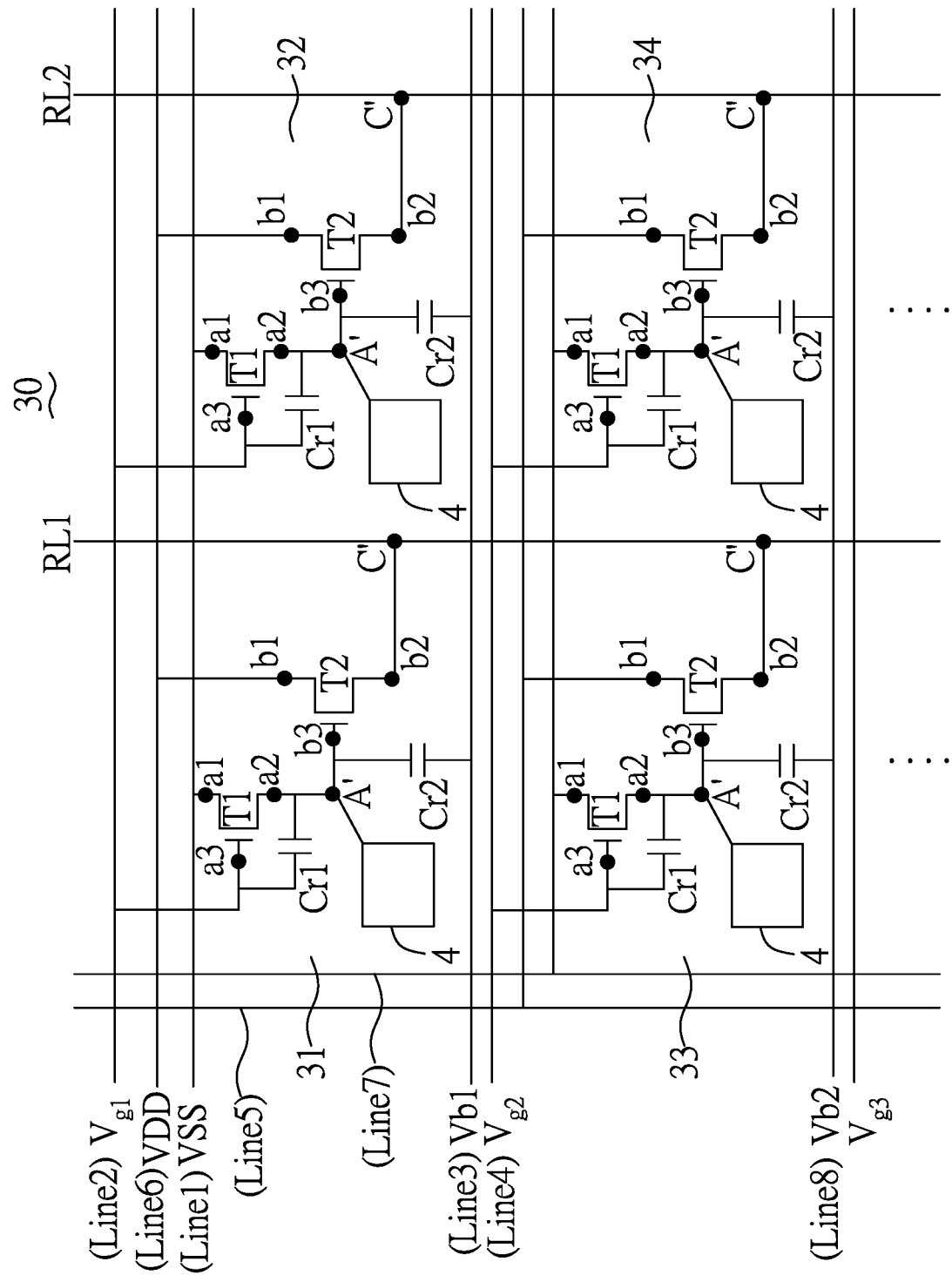
FIG. 9 is a schematic diagram illustrating the structure of the sensor component array according to the second embodiment of the present disclosure.

Please refer to FIG. 9, which is a schematic diagram illustrating the structure of the sensor component array 30 according to the second embodiment of the present disclosure. In one embodiment, when a plurality of sensor components 2 of the second embodiment form a sensor component array 30, the operation of the sensor component array 30 is such that, when the first transistors T1 of all the sensor components 2 have been turned on in the first operation stage P1, the electronic device 1 enters the second operation stage P2. In other words, the sensor component 2 of the second embodiment performs touch detection only in the second operation stage P2, but the present disclosure is not limited thereto this. For example, in some embodiments, the touch detection may be performed after the first transistors T1 of part of the sensor components 2 are turned on.

Next, the details of the sensor component array 30 composed of a plurality of sensor components 2 of the second embodiment will be described, and please also refer to FIG. 1 to FIG. 9 at the same time. For the convenience of description, FIG. 9 also illustrates that the sensor component array 30 includes four sensor components 2 (for example, sensor component 31, sensor component 32, sensor component 33 and sensor component 34) with the same structure.

As shown in FIG. 9, the first terminal a1 of the sensor component 31 and the first terminal a1 of the sensor component 32 in the first row are connected to the first signal line Line1 at the same time, and each receives the voltage VSS from the first signal line Line1. In addition, the voltage VSS can be transmitted to the first terminal a1 of different row along with a fifth signal line Line5. The first control terminal a3 of the sensor component 31 and the first control terminal a3 of the sensor component 32 are connected to the second signal line Line2 at the same time, and each receives the first one of control signals Vg1 from the second signal line Line2 for use as its own first control signal Vgn (labeled in FIG. 7). The second capacitor Cr2 of the sensor component 31 and the second capacitor Cr2 of the sensor component 32 are connected to the third signal line Line3 at the same time, and each receives the first one of bias signals Vb1 from the third signal line Line3. The third terminal b1 of the sensor component 31 and the third terminal b1 of the sensor component 32 in the first row are connected to a sixth signal line Line6 at the same time, and each receives the voltage VDD from the sixth signal line Line6. In addition, the voltage VDD may be transmitted to the third terminal b1 of different row along with a seventh signal line Line7. Besides, the first control terminal a3 of the sensor component 33 and the first control terminal a3 of the sensor component 34 in the second row may be connected to the fourth signal line Line4, and each receives the second one of control signals Vg2 from the fourth signal line Line4 for use as its own first control signal Vgn (labeled in FIG. 7). The second capacitor Cr2 of the sensor component 33 in the second row and the second capacitor Cr2 of the sensor component 34 may be connected to the eighth signal line Line8 at the same time, and each receives the second one of bias signals Vb2 from the eighth signal line Line8. The rest may be deduced by analogy.

FIG. 10 is a signal timing diagram of the sensor component array of the embodiment in FIG. 9. As shown in FIGS. 9 and 10, in the first operation stage P1, a plurality of control signals (for example, Vg1~Vgm, where m is a positive integer greater than 1) are respectively inputted to the first control terminals a3 of the sensor components 2 in different rows and are sequentially changed to high voltages at different time points, and each serves as the first control signal Vgn of the sensor component 2 of one row. In addition, in the second operation stage P2, a plurality of bias signals (for example, Vg1~Vgm, where m is a positive integer greater than 1) are sequentially changed to high voltages at different time points, and each serves as the bias signal Vb of the sensor component 2 of one row. The rest may be deduced by analogy with reference to FIG. 6. As a result, the structure and operation of the sensor component array 30 of the second embodiment can be understood.

Next, the influence of the size of the sensor pad 4 will be described. Sensor pads 4 of different sizes can support the touch of objects of different sizes. Taking a general touch display device as an example, the touch resolution of a touch display device that supports finger touch is about 6.2 pixels per inch (pixels) or less, wherein the touch resolution refers to the number of sensor pads included within the length of one inch in a direction (for example, the extension direction of the first signal line Line1 in FIG. 9). Therefore, the size of the sensor pad 4 (that is, the maximum length measured in the direction) needs to be less than or equal to 4 millimeters (mm) in order to realize finger touch sensing. The touch resolution of the present disclosure may be greater than or equal to 80 ppi, and thus the size of the sensor pad 4 needs to be less than or equal to 0.31 mm, so as to achieve an effect of high touch resolution effect and support the touch control with the fingers, stylus, and stylus brush. For example, in one embodiment, the touch resolution may reach 127 ppi (that is, the size of the sensor pad 4 needs to be less than or equal to 0.2 mm), but the present disclosure is not limited thereto. As a result, the influence of the size of the sensor pad 4 on the present disclosure can be understood.

In one embodiment, the present disclosure may at least be used as proof of whether the object falls within the scope of patent protection by comparing the presence or absence of components and connection thereof in the electronic device 1, but it is not limited thereto. In one embodiment, the electronic device 1 manufactured in the aforementioned embodiment can be used as a touch device. Furthermore, if the electronic device 1 manufactured in the aforementioned embodiment is a display device or a touch display device, it can be applied to any products known in the art that require a display screen, such as displays, mobile phones, notebook computers, video cameras, cameras, music players, mobile navigation devices, TVs, car dashboards, center consoles, electronic rearview mirrors, head-up displays, and other products that need to display images.

Accordingly, the present disclosure provides an improved electronic device capable of providing high touch resolution, or simplifying the circuit structure required to achieve the same touch resolution in the prior art, or reducing the cost of the required components to achieve the same touch resolution as the prior art.

The features of the embodiments disclosed in the present disclosure can be mixed and matched arbitrarily as long as they do not violate the spirit of the disclosure or conflict with each other.

The aforementioned specific embodiments should be construed as merely illustrative, and not limiting the rest of the present disclosure in any way.

What is claimed is:

1. An electronic device, comprising:
a signal readout line;
a sensor component electrically connected to the signal readout line, wherein the sensor component comprises:
a pixel sensor, comprising:
a first transistor including a first terminal, a second terminal and a first control terminal;
a first capacitor electrically connected to the first control terminal and the second terminal; and
a second transistor including a third terminal, a fourth terminal and a second control terminal, wherein the fourth terminal is electrically connected to the signal readout line; and
a sensor pad electrically connected to the second terminal;
wherein the electronic device further comprises a first conductive layer serving as a gate or a gate line for the first transistor or the second transistor, and a second conductive layer,
wherein the electronic device further comprises a first electrode layer serving as the sensor pad or a common electrode, and a second electrode layer serving as a pixel electrode, wherein the first electrode layer and the second electrode layer are ITO layers.

2. The electronic device of claim 1, wherein the pixel sensor further comprises a second capacitor electrically connected to the second terminal and a bias signal.

3. The electronic device of claim 2, wherein the bias signal has different voltages at different time points.

4. The electronic device of claim 1, wherein the sensor component outputs a first output value when no object approaches or contacts the sensor component, the sensor component outputs a second output value when an object approaches or contacts the sensor component, and the first output value is different from the second output value.

5. The electronic device of claim 1, wherein the pixel sensor further comprises a third transistor including a fifth terminal, a sixth terminal and a third control terminal, in which the third control terminal is electrically connected to the second terminal, and the sixth terminal is electrically connected to the third terminal.

6. The electronic device of claim 5, wherein the first terminal is electrically connected to a first voltage, the second terminal is electrically connected to the third transistor, and the first control terminal is electrically connected to a first control signal.

7. The electronic device of claim 5, wherein the third terminal is electrically connected to the third transistor, the second control terminal is electrically connected to a second control signal, and the fourth terminal is electrically connected to the signal readout line.

8. The electronic device of claim 5, wherein the third terminal is electrically connected to the third transistor, the second control terminal is electrically connected to a second control signal, and the fourth terminal is electrically connected to the signal readout line, and the fifth terminal is electrically connected to a second voltage.

9. The electronic device of claim 5, wherein the fifth terminal is electrically connected to a second voltage.

10. The electronic device of claim 1, wherein the pixel sensor further comprises a second capacitor electrically connected to the second terminal and a bias signal, and a capacitance value of the second capacitor is greater than a capacitance value of the first capacitor.

11. The electronic device of claim 10, wherein the capacitance value of the second capacitor is 2 to 4 times the capacitance value of the first capacitor.

12. The electronic device of claim 1, further comprising a further sensor component and a plurality of signal lines, wherein the sensor component and the further sensor component are electrically connected to the signal readout line and one of the plurality of signal lines.

13. The electronic device of claim 12, wherein the further sensor component includes a further first transistor including a further first control terminal, and the second control terminal and the further first control terminal are electrically connected to the one of the plurality of signal lines.

14. The electronic device of claim 1, wherein the sensor pad has a resolution greater than or equal to 80 ppi.

15. The electronic device of claim 1, wherein the second control terminal is electrically connected to the second terminal.

16. The electronic device of claim 15, wherein the first terminal is electrically connected to a voltage, and the third terminal is electrically connected to another voltage.

17. The electronic device of claim 1, wherein the first electrode layer and the first conductive layer at least partially overlap with each other to form the first capacitor.

18. The electronic device of claim 1, wherein the first electrode layer and the second electrode layer at least partially overlap with each other to form the second capacitor.

* * * * *